(12) United States Patent
Oh et al.

(10) Patent No.: US 12,334,299 B2
(45) Date of Patent: Jun. 17, 2025

(54) CHARGED PARTICLE BEAM DEVICE

(71) Applicant: Hitachi High-Tech Corporation, Tokyo (JP)

(72) Inventors: U Oh, Tokyo (JP); Minoru Yamazaki, Tokyo (JP); Yuko Sasaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 455 days.

(21) Appl. No.: 17/915,034

(22) PCT Filed: Mar. 31, 2020

(86) PCT No.: PCT/JP2020/014739
§ 371 (c)(1),
(2) Date: Sep. 27, 2022

(87) PCT Pub. No.: WO2021/199235
PCT Pub. Date: Oct. 7, 2021

(65) Prior Publication Data
US 2023/0162943 A1  May 25, 2023

(51) Int. Cl.
*H01J 37/22* (2006.01)
*G01N 23/2251* (2018.01)
(Continued)

(52) U.S. Cl.
CPC ........ *H01J 37/222* (2013.01); *G01N 23/2251* (2013.01); *G06F 16/2455* (2019.01);
(Continued)

(58) Field of Classification Search
CPC .. H01J 37/00; H01J 37/02; H01J 37/26; H01J 37/28; H01J 37/222; H01J 37/265;
(Continued)

(56) References Cited

U.S. PATENT DOCUMENTS 4,547,669 A * 10/1985 Nakagawa .............. H01J 37/04
250/397
8,853,630 B2  10/2014 Miyamoto et al.
(Continued)

FOREIGN PATENT DOCUMENTS

JP       H04-118847 A    4/1992
JP     2003-346695 A   12/2003
(Continued)

OTHER PUBLICATIONS

Korean Office Action issued in corresponding Korean Application No. 10-2022-7031069, dated Aug. 20, 2024 with Machine translation (14 pages).
(Continued)

*Primary Examiner* — Jason L McCormack
(74) *Attorney, Agent, or Firm* — Foley & Lardner LLP

(57) ABSTRACT

The present invention provides a charged particle beam device with which optimal parameters for the device can be effectively derived in a short time period. This charged particle beam device comprises: an electron gun (1) that irradiates a sample (10) with an electron beam (2); an image processing unit (901) that acquires an image of the sample (10) from a signal (12) generated by the sample (10) due to the electron beam (2); a database (604) that holds correspondence between a first parameter that is an optical condition, a second parameter that is a value pertaining to device performance, and a third parameter that is information pertaining to the device configuration, and stores a plurality of analysis values and measurement values; and a learning machine (605) that searches the database (604) and derives a first parameter that satisfies a target value of the second parameter.

6 Claims, 8 Drawing Sheets

(51) Int. Cl.
*G06F 16/2455* (2019.01)
*H01J 37/28* (2006.01)

(52) U.S. Cl.
CPC .......... *H01J 37/28* (2013.01); *G01N 2223/07* (2013.01); *G01N 2223/418* (2013.01); *G01N 2223/507* (2013.01); *G01N 2223/6116* (2013.01); *H01J 2237/24521* (2013.01); *H01J 2237/24564* (2013.01); *H01J 2237/24578* (2013.01)

(58) Field of Classification Search
CPC ............ H01J 37/15; H01J 37/244; H01J 2237/24564; H01J 2237/24578; H01J 2237/2485; G01N 23/2251; G01N 2223/07; G01N 2223/507; G01N 2223/6116; G01N 2223/304; G01N 2223/306; G01N 2223/32; G01N 2223/401; G01N 20/00; G06F 16/2455
USPC .................................. 250/306, 307, 310, 311
See application file for complete search history.

(56) References Cited

U.S. PATENT DOCUMENTS

| | | |
|---|---|---|
| 2006/0016990 A1 | 1/2006 | Suzuki et al. |
| 2006/0068301 A1 | 3/2006 | Hirukawa |
| 2007/0164219 A1 | 7/2007 | Shishido et al. |
| 2007/0228276 A1* | 10/2007 | Makino .................. H01J 37/265 250/310 |
| 2008/0017797 A1* | 1/2008 | Cheng ................... H01J 37/266 250/310 |
| 2009/0281755 A1 | 11/2009 | Funakoshi |
| 2014/0001359 A1 | 1/2014 | Ezumi et al. |
| 2014/0145078 A1 | 5/2014 | Miyamoto et al. |
| 2014/0231666 A1 | 8/2014 | Akima et al. |
| 2018/0182596 A1 | 6/2018 | Suzuki |
| 2019/0064755 A1 | 2/2019 | Ohmori et al. |
| 2019/0295890 A1 | 9/2019 | Clark et al. |

FOREIGN PATENT DOCUMENTS

| | | |
|---|---|---|
| JP | 2006-032202 A | 2/2006 |
| JP | 2007-187538 A | 7/2007 |
| JP | 2012-178359 A | 9/2012 |
| JP | 2013-030278 A | 2/2013 |
| JP | 2018-106832 A | 7/2018 |
| TW | 200507054 A | 2/2005 |
| TW | 201941328 A | 10/2019 |

OTHER PUBLICATIONS

English Translation of the International Search Report issued in International Application No. PCT/JP2020/014739 dated Jul. 7, 2020.

Office Action issued in corresponding Taiwanese Application No. 110108505, dated Jan. 6, 2022.

* cited by examiner

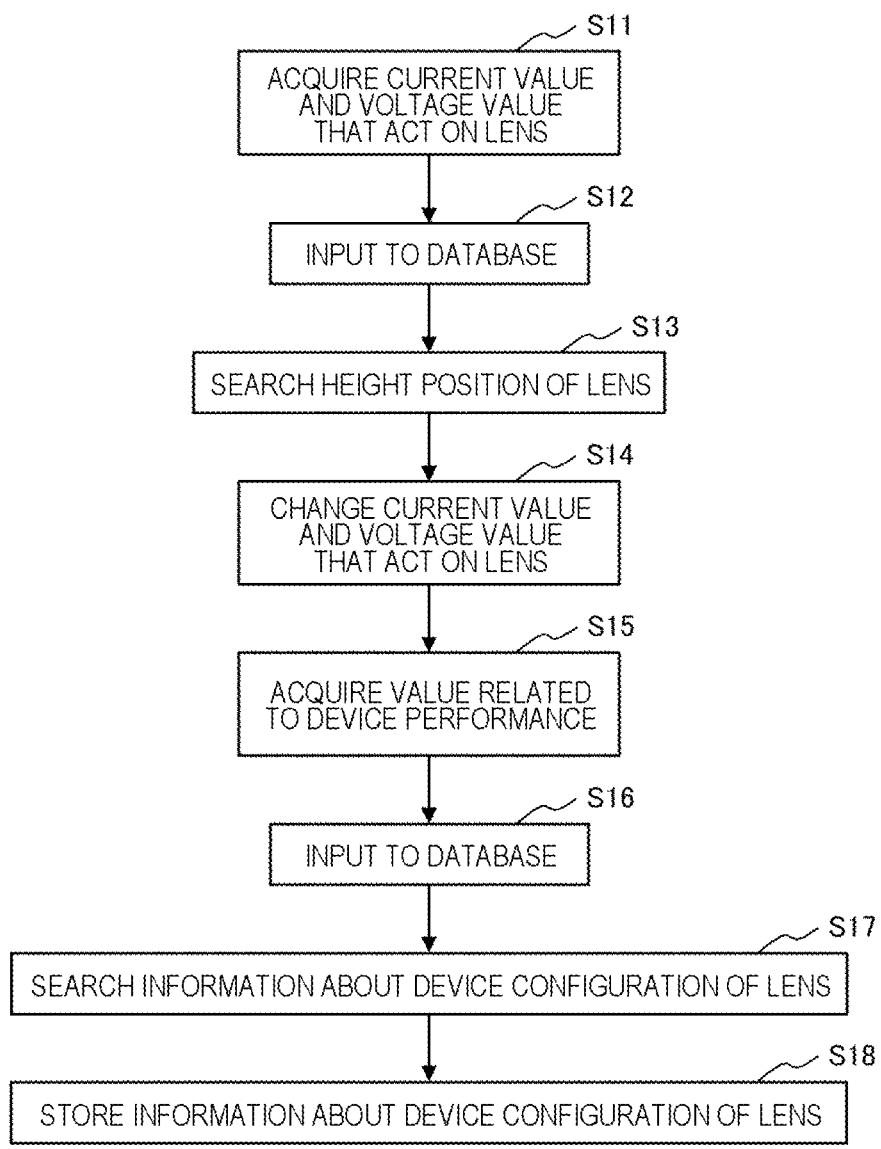

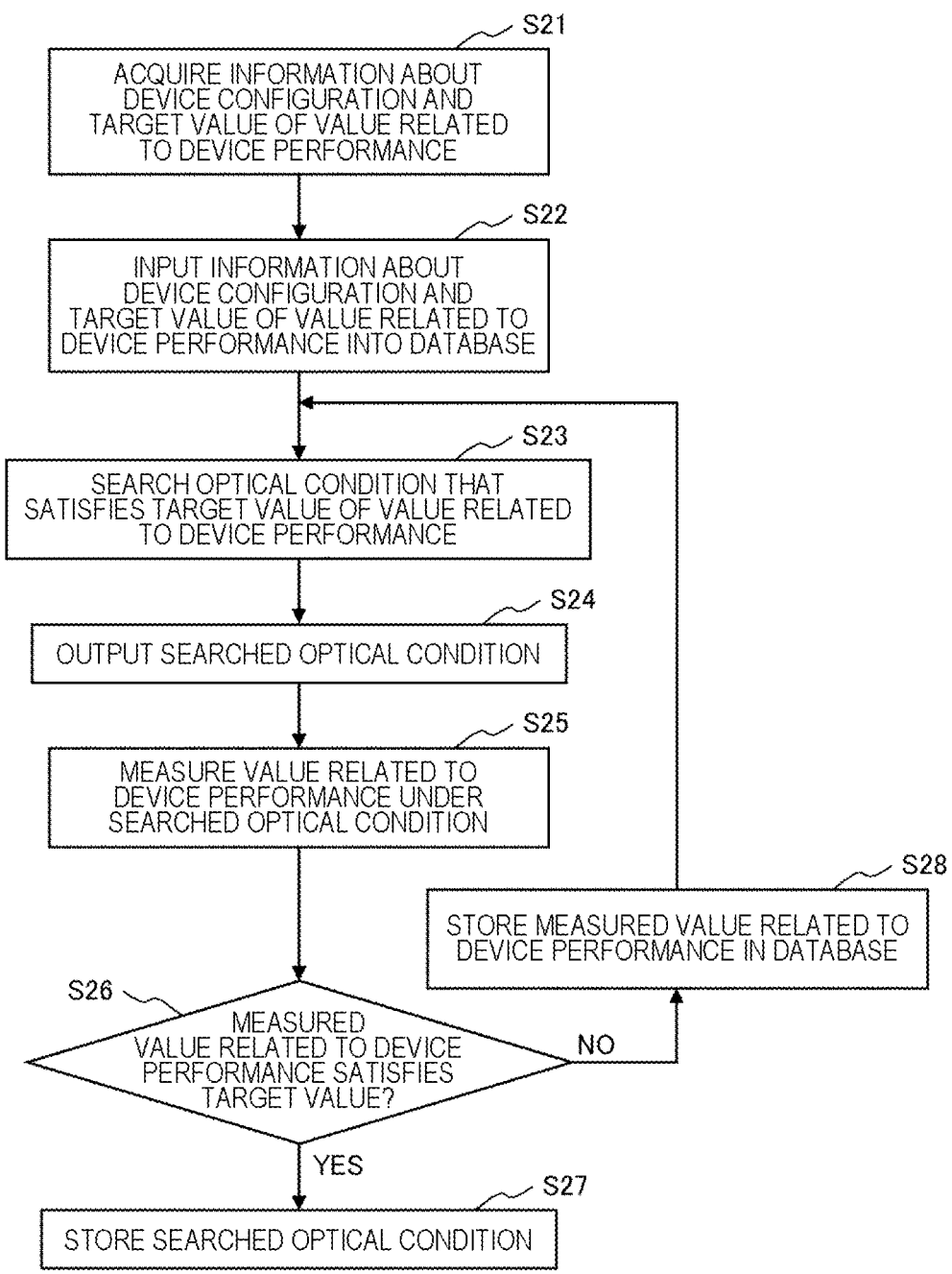

FIG. 3

| INPUT ITEM | OUTPUT ITEM |
|---|---|
| ACCELERATION VOLTAGE V0 | LENS POSITION |
| DECELERATION VOLTAGE Vr | LENS INCLINATION ANGLE |
| WORKING DISTANCE | AXIAL DEVIATION AMOUNT |
| ABERRATION AMOUNT | |

FIG. 4

| INPUT ITEM | | | OUTPUT ITEM | | |
|---|---|---|---|---|---|
| PRESSURIZATION VOLTAGE | ... | ABERRATION AMOUNT | POSITION | INCLINATION ANGLE | AXIAL DEVIATION AMOUNT |
| 4000 | ... | 1.2 | −530 | 0.01 | 0.1 |
| 4100 | ... | 1.1 | −530 | 0.015 | 0.1 |
| ⋮ | ⋮ | ⋮ | ⋮ | ⋮ | ⋮ |
| ⋮ | ⋮ | ⋮ | ⋮ | ⋮ | ⋮ |

FIG. 6

| INPUT ITEM | OUTPUT ITEM |
|---|---|
| ABERRATION AMOUNT | VOLTAGE VALUE |
| INCIDENT ANGLE | CURRENT VALUE |
| DETECTION EFFICIENCY | LANDING VOLTAGE |
| ACCELERATION VOLTAGE V0 | |
| DECELERATION VOLTAGE Vr | |
| WORKING DISTANCE | |
| LENS POSITION | |
| LENS INCLINATION ANGLE | |
| AXIAL DEVIATION AMOUNT | |

FIG. 7

| INPUT ITEM | | | OUTPUT ITEM | | |
|---|---|---|---|---|---|
| ABERRATION AMOUNT | INCIDENT ANGLE | DETECTION EFFICIENCY | VOLTAGE VALUE | CURRENT VALUE | LANDING VOLTAGE |
| 1.25 | 50 | 80 | 230 | 260 | 4200 |
| 1.30 | 15 | 75 | 231 | 250 | 4100 |
| ⋮ | ⋮ | ⋮ | ⋮ | ⋮ | ⋮ |
| ⋮ | ⋮ | ⋮ | ⋮ | ⋮ | ⋮ |

CHARGED PARTICLE BEAM DEVICE

TECHNICAL FIELD

The present invention relates to a charged particle beam device that irradiates a sample with a charged particle beam, detects a signal containing secondary electrons generated from the sample, and obtains an image.

BACKGROUND ART

There is a scanning electron microscope (hereinafter, referred to as "SEM") as a charged particle beam device that irradiates a sample with a charged particle beam and detects a signal (secondary electron) secondarily generated from the sample to obtain an image. In particular, in a semiconductor wafer inspection device using an SEM, in order to observe a surface of a semiconductor wafer having a large area, it is required to acquire a high-resolution SEM image while maintaining a high throughput. In addition, miniaturization of semiconductor wafers has progressed year by year, and there is an increasing demand for improvement of measurement reproducibility of the SEM, reduction of measurement errors between devices, and the like. Hereinafter, reducing measurement errors between the devices so as to obtain the same measurement result between the devices is referred to as "matching".

In order to obtain a high-resolution SEM image, it is necessary to correctly set optical conditions of the device when irradiating a wafer with electron beam. The optical conditions are, for example, an acceleration voltage of the electron beam, an aperture angle of the electron beam, a current value of the electron beam, and a voltage of each electrode. For matching, not only the optical conditions but also information obtained from the SEM image and state of the electron beam need to be the same between the devices. The information obtained from the SEM image is, for example, a line profile and a length measurement value of the wafer. The information obtained from the SEM image varies depending on a shape of the wafer, the optical conditions and configuration conditions of the device, and the like. The configuration condition of the device is, for example, a shape of the lens, a position of the lens in a height direction, a position of the lens in a lateral direction, an inclination angle of the lens, and a flatness of the lens.

When the matching is performed, it is necessary to readjust the optical conditions such that the measurement error between the devices becomes equal to or less than a predetermined threshold while considering the optical conditions and the configuration conditions of the devices. In an adjustment work of the optical condition, an operator needs to know the mechanism of the device and the interaction between each adjustment item for each device to be matched, and the selection of the adjustment item differs depending on the knowledge of the operator. Furthermore, since a plurality of optical conditions is handled at the same time, it takes a long time to perform the matching operation. Therefore, there is a demand for a device capable of performing matching work in a short time.

Examples of conventional charged particle beam devices are described in Patent Documents (PTLs) 1 and 2.

PTL 1 discloses a charged particle beam device capable of performing condition setting with high accuracy. The charged particle beam device of PTL 1 compares the calculated optical conditions acquired by the trajectory calculation with the optical conditions acquired by performing image adjustment on the obtained SEM image, and stores the optical conditions when they match.

PTL 2 discloses a charged particle beam device that reduces a measurement dimensional difference (machine difference) between devices, and describes that a sample in which a large number of pyramidal (quadrangular pyramidal) polyhedral structures are arranged is used as a wafer used for calibration for reducing the machine difference.

CITATION LIST

Patent Literature

PTL 1: JP 2006-32202 A
PTL 2: JP 2007-187538 A

SUMMARY OF INVENTION

Technical Problem

In the charged particle beam device described in PTL 1, parameters such as optical conditions and configuration conditions of the device are changed one by one and comparison is performed until the optical conditions acquired by analysis and the optical conditions acquired by measurement match. However, since the number of combinations of parameters is enormous, such a conventional technique has a problem that it takes a long time to search for a matching optical condition.

An object of the present invention is to provide a charged particle beam device capable of efficiently obtaining optimum parameters of the device in a short time.

Solution to Problem

A charged particle beam device according to the present invention includes an electron gun that irradiates a sample with an electron beam, an image processing unit that acquires an image of the sample from a signal generated by the sample due to the electron beam, a database that holds correspondence between a first parameter that is an optical condition, a second parameter that is a value related to device performance, and a third parameter that is information on the device configuration, and stores a plurality of analysis values and measurement values, and a learning machine that searches the database and obtains the first parameter that satisfies a target value of the second parameter.

Advantageous Effects of Invention

According to the present invention, it is possible to provide a charged particle beam device capable of efficiently obtaining an optimum parameter of the device in a short time.

BRIEF DESCRIPTION OF DRAWINGS

FIG. 2A is a diagram illustrating processing of step 1 in the first embodiment.

FIG. 2B is a diagram illustrating processing of step 2 in the first embodiment.

FIG. 3 is a diagram illustrating an example of items input to a database and items output from the database in the step 1 of the first embodiment.

FIG. 4 is a diagram illustrating an example of a configuration of the database in the first embodiment.

FIG. 6 is a diagram illustrating an example of items input to a database and items output from the database in the second embodiment.

FIG. 7 is a diagram illustrating an example of a configuration of the database in the second embodiment.

DESCRIPTION OF EMBODIMENTS

Figure 1:
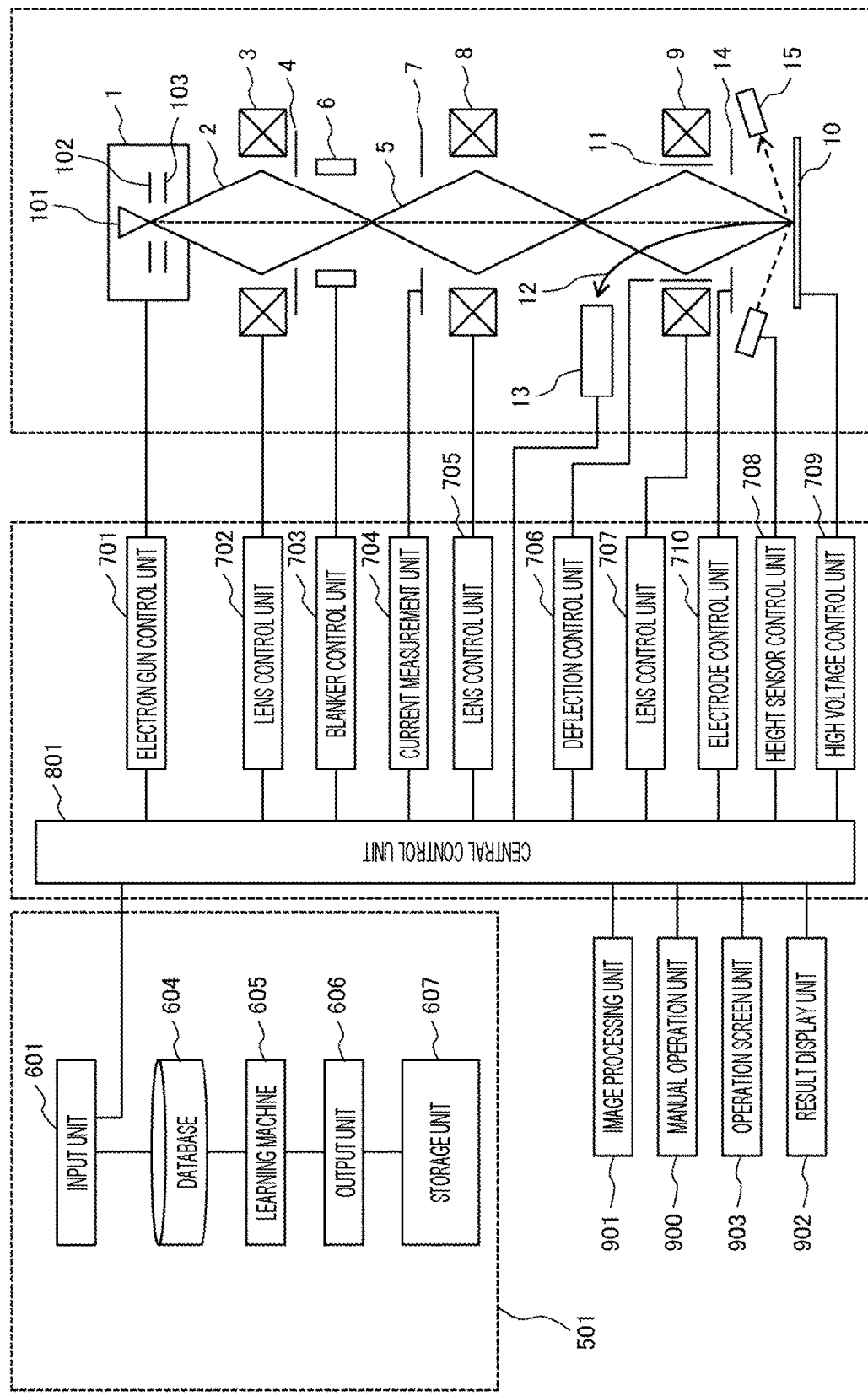
FIG. 1 is a diagram illustrating a configuration of a charged particle beam device according to a first embodiment of the present invention.

A charged particle beam device according to the present invention includes a database that stores analysis values and measurement values for parameters related to the device, and obtains an optimum parameter using the database. In the database, for the parameters of a plurality of items under as many conditions as possible, the analysis values and the measurement values in the widest possible range are stored while a correspondence between the parameters is maintained. That is, a value of an arbitrary one parameter and a value of another parameter when the value of the arbitrary one parameter is obtained are stored in the database in association with each other. When matching is performed, an optical condition that satisfies a target value of the parameter is searched from the database, so that an optimal parameter of the device can be efficiently obtained in a short time.

Hereinafter, a charged particle beam device according to an embodiment of the present invention will be described with reference to the drawings. Hereinafter, a scanning electron microscope (SEM) will be described as an example of the charged particle beam device. In the drawings used in the present specification, the same or corresponding components are denoted by the same reference numerals, and repeated description of these components may be omitted.

In the present specification, the parameters related to the charged particle beam device will be described by being divided into three types of an optical condition (first parameter), a value related to device performance (second parameter), and information on a device configuration (third parameter). The optical condition (first parameter) includes an acceleration voltage and a deceleration voltage of an electron beam, an aperture angle of the electron beam, a current value of the electron beam, a voltage of each electrode, a current value and a voltage value of a lens, a current value and a voltage value of a deflector, a landing voltage (incident voltage of the electron beam on the sample), and a probe current. The value related to device performance (second parameter) is a value of an item indicating device performance, and includes an aberration amount, a line profile, a beam diameter, an angular magnification, a rotation angle, deflection sensitivity, a deflection amount, a detection efficiency, and an incident angle of an electron beam. The information on the device configuration (third parameter) is an item indicating information on physical arrangement of the components of the device, and includes a shape of the lens, a position of the lens in a height direction, a position of the lens in a lateral direction, an inclination angle of the lens, an amount of axial displacement of the lens, a flatness of the lens, and a position of the sample in the height direction (working distance).

First Embodiment

FIG. 1 is a diagram illustrating a configuration of a charged particle beam device according to a first embodiment of the present invention. The charged particle beam device according to the present embodiment includes an electron gun 1, a first converging lens 3, a blanker 6, a Faraday cup 7, a second converging lens 8, an objective lens 9, a deflector 11, a secondary electron detector 13, a control electrode 14, and a height sensor 15. The charged particle beam device according to the present embodiment further includes following components 701 to 710.

The electron gun 1 is controlled by an electron gun control unit 701, and emits an electron beam 2 which is a charged particle beam by an extraction voltage applied between an electron source 101 and an extraction electrode 102 and thermal energy applied to the electron source 101. The electron beam 2 is accelerated by the acceleration voltage Vo applied to an acceleration electrode 103, and is emitted from the electron gun 1 to a sample 10.

The first converging lens 3 is controlled by a lens control unit 702. The electron beam 2 is converged by the first converging lens 3 and narrowed by a diaphragm 4 to become an electron probe 5.

The blanker 6 is controlled by a blanker control unit 703, and deflects the electron probe 5 as necessary.

The Faraday cup 7 detects a probe current Ip with which the sample 10 is irradiated. The probe current Ip is measured by a current measurement unit 704.

The second converging lens 8 is controlled by a lens control unit 705. The objective lens 9 is controlled by a lens control unit 707. The electron probe 5 is further converged by the second converging lens 8 and focused on the sample 10 by the objective lens 9. At this time, the electron probe 5 is decelerated by a deceleration voltage Vr applied to the sample 10. The deceleration voltage Vr is controlled by a high voltage control unit 709.

The deflector 11 is controlled by a deflection control unit 706. The electron probe 5 scans the sample 10 by the deflector 11.

The secondary electron detector 13 detects secondary electrons 12 which are signals generated from the sample 10 by irradiation of the electron probe 5. The signal generated from the sample 10 includes reflected electrons.

The control electrode 14 is arranged near the objective lens 9, is controlled by an electrode control unit 710, and controls a trajectory of the secondary electrons 12 by applied control voltage. The control electrode 14 controls charge amount of the sample 10 by applying a voltage higher than the voltage applied to the sample 10 to increase an amount of the secondary electrons 12 detected by the secondary electron detector 13, or applying a voltage lower than the voltage applied to the sample 10 to return the secondary electrons 12 to the sample 10, as necessary.

The height sensor 15 is controlled by a height sensor control unit 708, and measures a position (working distance) of the sample 10 in a height direction.

The charged particle beam device according to the present embodiment further includes a central control unit 801, a manual operation unit 900, an operation screen unit 903, a result display unit 902, and an image processing unit 901.

The central control unit 801 is connected to components 701 to 710 and components 900 to 903, and controls the charged particle beam device.

The manual operation unit 900 is an input unit for an operator to operate the charged particle beam device via the central control unit 801.

The operation screen unit 903 displays information necessary for the operator to operate the charged particle beam device. For example, the operation screen unit 903 displays a list of optical conditions.

The result display unit 902 displays information obtained by the charged particle beam device according to the present embodiment, such as optical conditions and line profiles.

The image processing unit 901 obtains an image of the sample 10 from a signal generated from the sample 10 by irradiation with the electron beam 2. In addition, the image processing unit 901 performs image processing on the image acquired by the charged particle beam device, calculates the incident angle of the electron beam 2 on the sample 10, and acquires information of the sample 10 such as line profile.

The charged particle beam device according to the present embodiment further includes a self-diagnosis system 501. The self-diagnosis system 501 includes an input unit 601, a database 604, a learning machine 605, an output unit 606, and a storage unit 607.

The input unit 601 inputs information necessary for the learning machine 605. For example, the input unit 601 inputs a value related to an optical condition (first parameter), a value related to device performance (second parameter), information on a device configuration (third parameter), and a target value (desired value) of the value related to device performance (second parameter).

The database 604 stores an estimated value (analysis value) which is an analysis result of the learning machine 605 and a measurement result (measurement value) of the charged particle beam device for the optical condition (first parameter), the value related to the device performance (second parameter), and the information on the device configuration (third parameter). The database 604 stores a plurality of values for each of the plurality of items of these parameters. The plurality of values of these parameters are stored in correspondence with each other.

The learning machine 605 performs analysis using the data stored in the database 604, searches for a value of an optimum optical condition, and estimates a feature of the device (information (third parameter) on the device configuration). The learning machine 605 can perform analysis using information (third parameter) on a device configuration assumed in advance and various optical conditions (first parameter) to obtain a value (second parameter) related to device performance.

The output unit 606 outputs the optical conditions (first parameters) searched by the learning machine 605 and the information (third parameters) on the device configuration to the central control unit 801 and the result display unit 902.

The storage unit 607 mainly stores information such as optical conditions (first parameters) obtained by estimation and searching by the learning machine 605 and information (third parameters) on the device configuration.

The database 604 and the learning machine 605 may be configured by a computer device provided inside the device, or may be configured by a computer device provided outside the device and connected to the device via a cable or a network. Furthermore, the database 604 and the learning machine 605 may be provided on a cloud.

An operator selects an optical condition to be used for inspection from the list of optical conditions displayed on the operation screen unit 903, and inputs these values to the central control unit 801 by operating the manual operation unit 900, whereby a control value of the charged particle beam device is determined. The control value of the charged particle beam device is a value of a parameter for controlling components of the device such as the objective lens 9, and includes, for example, optical conditions such as an acceleration voltage Vo, a deceleration voltage Vr, and a probe current Ip. When the control value is determined, the charged particle beam device can obtain an image of the sample 10 by imaging the sample 10. The operation screen unit 903 displays the control value such as optical conditions stored in the database 604.

In the charged particle beam device as described above, since the operator selects optimum optical conditions according to a type of wafer and a pattern forming process, it is necessary to store many optical conditions in the database 604 in advance. However, in order to obtain the optimum optical condition including matching, it is necessary to consider the influence of the change in the device configuration and the control value on the device as well as the information (third parameter) on the device configuration and the control value of the device, and these considerations take a long time since the number of combinations of parameters is enormous.

Therefore, the charged particle beam device according to the present embodiment includes the self-diagnosis system 501 in order to obtain the optimum optical condition including the matching in consideration of the characteristics of the device. The charged particle beam device according to the present embodiment can search for an optimal optical condition including matching by using the database 604, the learning machine 605, and the results measured by the charged particle beam device.

Next, in the charged particle beam device according to the present embodiment, a method of obtaining an optimum optical condition in consideration of the characteristics of the device will be described. The charged particle beam device according to the present embodiment searches for an optimum optical condition in consideration of the characteristics of the device by performing the following two steps.

Step 1 is an estimation of characteristics (information on the device configuration (third parameter)) of each device generated at the time of manufacturing and assembling. In the charged particle beam device, there is a difference in configuration between the devices at the time of manufacture and at the time of assembly, and information (third parameter) on the device configuration is different between the devices. In the step 1, information (third parameter) on a device configuration that is a feature of each device is estimated.

In step 2, an optical condition (first parameter) satisfying a value (second parameter) related to target device performance is searched using the database 604 based on the information (third parameter) on the device configuration estimated in the step 1.

The database 604 stores analysis results and experimental results (measurement results) of optical conditions (first parameters), values (second parameters) related to device performance, and information (third parameters) on the device configuration under as many conditions as possible regarding the device. In the database 604, for each of the plurality of items of these parameters, analysis results and experimental results (measurement results) of values in the widest possible range are stored in correspondence with each other.

First, the step 1 will be described. In the step 1, information (third parameter) on the device configuration of a plurality of items is estimated.

FIG. 2A is a diagram illustrating processing of the step 1. The step 1 is performed for each component of the charged particle beam device. FIG. 2A mainly illustrates processing for the objective lens 9 as an example of components of the charged particle beam device.

In S11, the charged particle beam device acquires a current value and a voltage value (optical condition (first parameter)) acting on the objective lens 9 by the lens control unit 707 under the condition set in the device, and acquires a position (working distance) in a height direction of the sample 10 (information on the device configuration (third parameter)) by the height sensor 15.

In S12, the current value and the voltage value acting on the objective lens 9 and the position in the height direction of the sample 10 acquired in S11 are input to the database 604. In the database 604, assumed values (second parameters) related to the performance of each device, information (third parameters) on the configuration, and analysis results performed under various optical conditions (first parameters) are stored in advance.

FIG. 3 is a diagram showing an example of items input to the database 604 and items output (searched) from the database 604 in the step 1.

FIG. 4 is a diagram illustrating an example of a configuration of the database 604. The database 604 stores values of the optical condition (first parameter), the value related to the device performance (second parameter), and the information on the device configuration (third parameter), which correspond to each other, in association with each other.

Returning to FIG. 2A, the description of the processing of the step 1 will be continued.

In S13, the learning machine 605 searches and obtains the position in the height direction of the objective lens 9 (information on the device configuration (third parameter)) when the current value and the voltage value (optical condition (first parameter)) of the objective lens 9 at the time of autofocusing to the position in the height direction of the sample 10 acquired in S11 are equal to the current value and the voltage value acquired in S11 from the database 604. That is, the learning machine 605 estimates the position in the height direction of the objective lens 9, which is the information (third parameter) on the device configuration, by searching the database 604 using the optical condition (first parameter).

In S14, the lens control unit 707 arbitrarily changes a current value and a voltage value (optical condition (first parameter)) acting on the objective lens 9.

In S15, after the current value and the voltage value of the objective lens 9 are changed, the device measures and acquires values (second parameters) related to device performance such as the aberration amount, the beam diameter, the angular magnification, the rotation angle, and the deflection sensitivity.

In S16, the current value and the voltage value (optical condition (first parameter)) of the objective lens 9 changed in S14 and the value (second parameter) related to the device performance measured in S15 are input to the database 604.

In S17, the learning machine 605 searches and obtains the information (third parameter) on the device configuration corresponding to the optical condition (first parameter) input in S16 from the database 604. In S17, the learning machine 605 estimates information (third parameter) on the device configuration such as the inclination angle, the axial deviation amount, and the flatness of the objective lens 9 by searching the database 604 using the optical condition (first parameter).

In S18, the learning machine 605 stores estimated information (third parameter) on the device configuration of the objective lens 9 in the storage unit 607.

For the components of the charged particle beam device such as the first converging lens 3, the second converging lens 8, and the deflector 11, the learning machine 605 estimates information (third parameter) on the device configuration in the same procedure as the procedure for the objective lens 9 and stores the estimated information in the storage unit 607. That is, also for the components other than the objective lens 9, the acting control value (for example, optical conditions (first parameter) such as a current value and a voltage value) is changed, and the changed control value and the value (second parameter) related to the measured device performance are input to the database 604. The learning machine 605 estimates information (third parameter) on the device configuration of each component of the charged particle beam device, and stores the estimated information (third parameter) on the device configuration in the storage unit 607.

Next, the step 2 will be described. In the step 2, the optimum optical conditions (first parameters) of a plurality of items are searched using the information (third parameters) on the device configuration estimated in the step 1 and stored in the storage unit 607.

FIG. 2B is a diagram illustrating processing of the step 2.

In step S21, the input unit 601 acquires a plurality of items of information (third parameters) on the device configuration stored in the storage unit 607. Further, the input unit 601 acquires target values (desired values) of values (second parameters) related to the device performance of a plurality of items, which are input by the operator operating the manual operation unit 900. As the target value of the value (second parameter) related to the device performance, a value in the device serving as a reference for matching may be used.

In S22, the input unit 601 inputs the information on the device configuration (third parameter) and the target value of the value related to the device performance (second parameter) acquired in S21 to the database 604.

In S23, the learning machine 605 searches and obtains a plurality of items of optical conditions (first parameters) that satisfy the target value of the value (second parameter) related to device performance acquired in S21 by the input unit 601 from the database 604. Under the condition of the information (third parameter) on the device configuration acquired by the input unit 601 in S21, the learning machine 605 searches the database 604 for the optical condition (first parameter) for giving the target value of the value (second parameter) on the device performance acquired by the input unit 601 or the optical condition (first parameter) for giving a value closest to the target value of the value (second parameter) on the acquired device performance.

In S24, the output unit 606 outputs the optical conditions (first parameters) searched by the learning machine 605 using the database 604 in S23 to the result display unit 902.

In S25, the device sets the optical conditions (first parameters) searched in S23 as the optical conditions of the device, and measures values (second parameters) related to device performance such as the aberration amount, the deflection amount, and the detection efficiency.

In S26, the learning machine 605 determines whether or not the measured value (second parameter) related to the device performance satisfies the target value. When the measured value (second parameter) related to the device performance satisfies the target value, the process proceeds to S27, and when the measured value does not satisfy the target value, the process proceeds to S28.

In S27, since the measured value (second parameter) related to the device performance satisfies the target value, the learning machine 605 stores the optical condition (first parameter) searched in S23 in the storage unit 607 as a new optical condition.

In S28, since the measured value (second parameter) related to the device performance does not satisfy the target value, the learning machine 605 stores the measured value (second parameter) related to the device performance and the optical condition (first parameter) when the value (second parameter) related to the device performance is obtained in the database 604 in association with each other. Then, returning to S23, the learning machine 605 again searches the database 604 for the optical condition (first parameter) that satisfies the target value of the value (second parameter) related to device performance acquired by the input unit 601 in S21. The learning machine 605 repeats the search until the measured value (second parameter) related to the device performance satisfies the target value.

Since the value (second parameter) related to the device performance and the optical condition (first parameter) are stored in the database 604 in S28, it is possible to improve the accuracy with which the learning machine 605 searches for the optical condition (first parameter) using the database 604 and to cause the learning machine 605 to learn. S28 is not necessarily executed, but is preferably executed so that the learning machine 605 can perform search with high accuracy.

In a conventional charged particle beam device, parameters of a plurality of items (information on a device configuration (third parameter) and an optical condition (first parameter)) are changed one by one to search for an optical condition (first parameter) that satisfies target values of values (second parameter) related to device performance of the plurality of items.

In the charged particle beam device according to the present embodiment, since the parameters of a plurality of items (information (third parameter) on the device configuration and the optical condition (first parameter)) stored in the database 604 are simultaneously searched, the optimum optical condition (first parameter) in consideration of the characteristics of the device can be efficiently obtained in a short time.

Second Embodiment

Device matching may reduce measurement errors under different optical conditions on the same device. For this purpose, it is necessary to make the state of the electron beam 2 the same and the value (second parameter) related to device performance the same even under different optical conditions. In the second embodiment, as an example, a procedure for making the incident angle of the electron beam 2 with which the sample 10 is irradiated the same among the values (second parameters) related to device performance will be described. In order to make the incident angle of the electron beam 2 the same, the procedure described in the first embodiment and the procedure described below are used.

The basic configuration of the charged particle beam device according to the present embodiment is the same as the configuration of the charged particle beam device according to the first embodiment illustrated in FIG. 1. The deflection control unit 706 controls the deflector 11 to control the incident angle of the electron beam 2 with which the sample 10 is irradiated.

Figure 5:
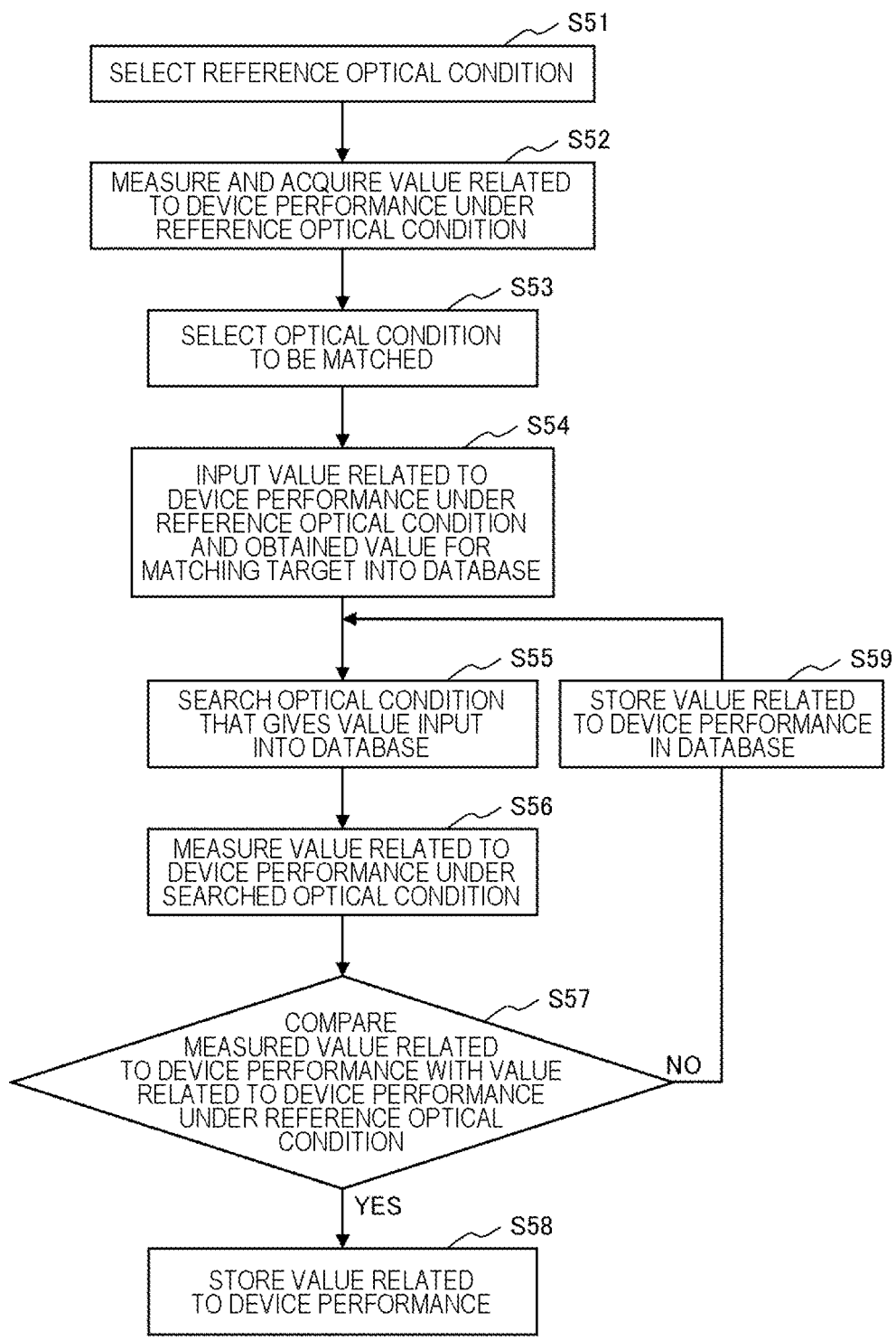
FIG. 5 is a diagram illustrating a procedure for making an incident angle of an electron beam with which a sample is irradiated the same in a second embodiment.

FIG. 5 is a diagram illustrating a procedure for making the incident angle of the electron beam 2 with which the sample 10 is irradiated the same.

FIG. 6 is a diagram illustrating an example of items input to the database 604 and items output (searched) from the database 604 in the present embodiment.

FIG. 7 is a diagram illustrating an example of a configuration of the database 604 in the present embodiment. The database 604 stores values of the optical condition (first parameter), the value related to the device performance (second parameter), and the information on the device configuration (third parameter), which correspond to each other, in association with each other.

In S51, the operator selects an optical condition (Hereinafter, referred to as "reference optical conditions") as a reference for matching from a list of optical conditions displayed on the operation screen unit 903.

In S52, the charged particle beam device measures and acquires values (second parameters) related to device performance such as an incident angle, an aberration amount, and a detection efficiency under the reference optical conditions in the charged particle beam device (hereinafter, referred to as a "matching target device") to be matched. At this time, any sample can be used as the sample 10, but a wafer in which a large number of pyramidal polyhedral structures are arranged as described in PTL 2 may be used.

In S53, the operator selects an optical condition (first parameter) to be matched from the list of optical conditions displayed on the operation screen unit 903.

In S54, the value (second parameter) related to the device performance under the reference optical condition measured in S52 is input to the database 604. Information (third parameter) on the device configuration of the matching target machine and the value of the optical condition to be matched (optical condition selected in S53) obtained by the same method as the steps 1 and 2 described in the first embodiment are input to the database 604.

In S55, the learning machine 605 searches the database 604 for the landing voltage and the voltage value and the current value (optical conditions) of the deflector 11 that give the values input into the database 604 in S54.

In S56, the charged particle beam device sets the landing voltage, the voltage value, and the current value searched in S55 as optical conditions, and measures values (second parameters) related to device performance such as the incident angle, the aberration amount, and the detection efficiency under the set optical conditions.

In S57, the value (second parameter) related to the device performance measured in S56 is compared with the value (second parameter) related to the device performance under the reference optical condition measured in S52. When the value measured in S56 matches the value under the reference optical condition, the process proceeds to S58, and when the value does not match the value under the reference optical condition, the process proceeds to S59.

In S58, since the value (second parameter) related to the device performance measured in S56 matches the value (second parameter) related to the device performance under the reference optical condition, the learning machine 605 stores the value related to the device performance measured in S56 in the storage unit 607 as the value related to the device performance under the optical condition to be matched.

In S59, since the value (second parameter) related to the device performance measured in S56 does not match the value (second parameter) related to the device performance under the reference optical condition, the learning machine 605 stores the value related to the device performance measured in S56 in the database 604. Then, the processing returns to S55, and the learning machine 605 performs the search again. The learning machine 605 repeats the search until the value measured in S56 matches the value under the reference optical condition.

In the above embodiment, the procedure of making the incident angle of the electron beam 2 the same even under different optical conditions has been described. In the present invention, in order to make the state of the electron beam 2 the same even under different optical conditions, other parameters can be searched and obtained in the same procedure as described above.

Third Embodiment

In the present embodiment, a configuration in which the database 604 is used in a plurality of charged particle beam devices will be described. When the database 604 is provided outside the plurality of charged particle beam devices, the database 604 can be shared and used by the respective devices, and matching between the devices can be easily performed.

Figure 8:
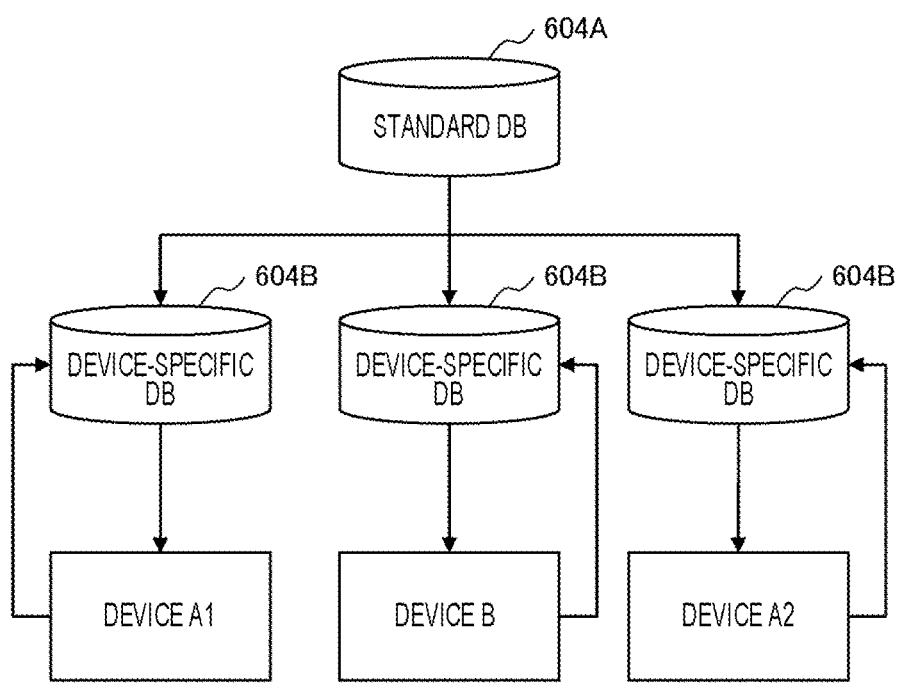
FIG. 8 is a diagram illustrating an outline of a system having a configuration in which a database is provided outside a plurality of charged particle beam devices in a third embodiment.

FIG. 8 is a diagram illustrating an outline of a system having a configuration in which the database 604 is provided outside the plurality of charged particle beam devices. The basic configuration of the charged particle beam device according to the present embodiment is the same as the configuration of the charged particle beam device according to the first embodiment illustrated in FIG. 1 except for the database 604.

FIG. 8 illustrates two devices A (A1 and A2) and one device B as the charged particle beam devices. The device A and the device B are charged particle beam devices having different types.

The database 604 includes two types of database: a standard database (DB) 604A and a plurality of device-specific databases (DB) 604B. The standard database 604A is connected to all the devices A1, A2, and B. The device-specific databases 604B are provided by the number of charged particle beam devices, and are connected to each of the device A1, the device A2, and the device B one by one.

The device A1 can access the standard database 604A and the device-specific database 604B connected to the device A1. The device A2 can access the standard database 604A and the device-specific database 604B connected to the device A2. The device B can access the standard database 604A and the device-specific database 604B connected to the device B.

The standard database 604A stores the analysis result performed for each charged particle beam device by the learning machine 605 of each charged particle beam device. For example, for each of the device A1, the device A2, and the device B, the standard database 604A stores the analysis results of the value (second parameter) related to device performance performed by each learning machine 605 under various optical conditions (first parameter) together with the optical conditions, respectively.

The device-specific database 604B stores measurement results of the connected charged particle beam devices. For example, the device-specific database 604B connected to the device A1 stores measurement results of optical conditions (first parameters), values related to device performance (second parameters), and information on a device configuration (third parameters) for the device A1.

When matching between a plurality of devices is performed, the charged particle beam device to be matched exchanges data between the standard database 604A and the device-specific database 604B to which the charged particle beam device is connected, acquires necessary information (for example, optical conditions, values related to device performance, and information on device configuration), and performs matching according to the procedure described in the first embodiment or the second embodiment.

When the database 604 is configured as in the present embodiment, the analysis result stored in the standard database 604A can be shared and used by a plurality of devices. Therefore, since the learning machine 605 can learn using more data, it is possible to efficiently perform matching for a plurality of devices in a short time.

Fourth Embodiment

In the present embodiment, a matching procedure using a line profile which is a value (second parameter) related to device performance will be described. As a method of performing matching between devices, there is a method of performing matching using a line profile of the imaged sample 10. The line profile is information obtained from an image obtained by imaging the sample 10. Hereinafter, a procedure of this matching method will be briefly described. The basic configuration of the charged particle beam device according to the present embodiment is the same as the configuration of the charged particle beam device according to the first embodiment illustrated in FIG. 1.

Figure 9:
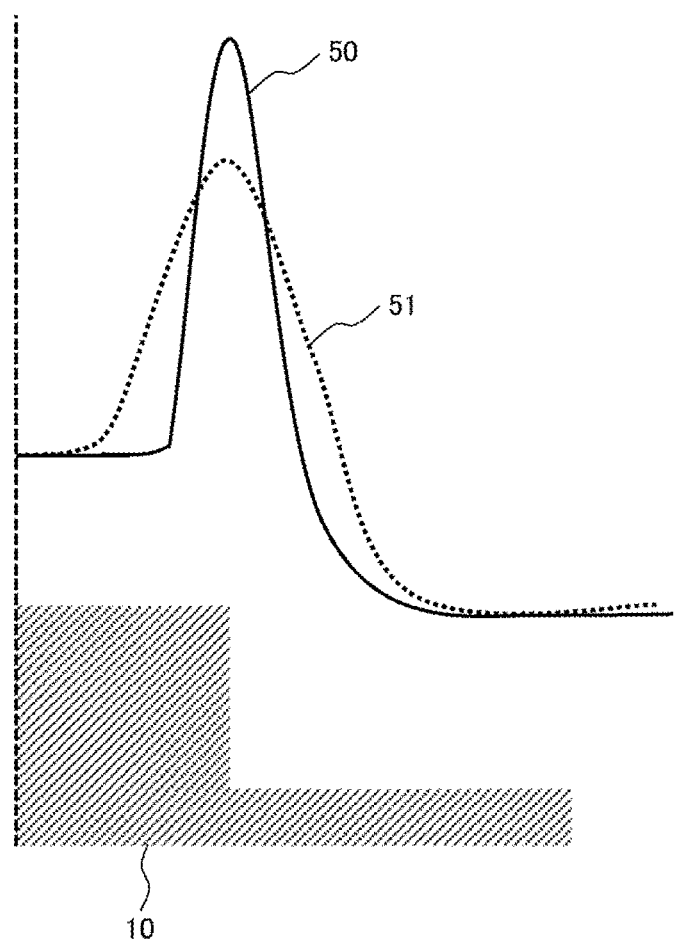
FIG. 9 is a diagram illustrating an example of a line profile serving as a reference for matching and an example of a line profile to be matched in a fourth embodiment.

FIG. 9 is a diagram illustrating an example of a line profile 50 serving as a reference for matching and an example of a line profile 51 to be matched. The line profile 50 serving as a reference of matching is a line profile of the sample 10 obtained by the charged particle beam device serving as a reference for matching. The line profile 51 to be matched is a line profile of the sample 10 obtained by the charged particle beam device to be matched.

In the charged particle beam device, a difference in the shape of the line profile is one of factors that causes a machine difference. Therefore, it is necessary to search for an optical condition in which the shape of the line profile 51 to be matched matches the shape of the line profile 50 as a reference for matching.

Analysis or experiment is performed in advance, and an image of the sample 10 is captured while changing optical conditions (first parameters) such as a landing voltage, an acceleration voltage, a deceleration voltage, and a current value of the electron beam 2 to acquire a line profile of the sample 10. The database 604 stores the acquired line profile. In addition, the learning machine 605 obtains a change in the line profile when the value of the optical condition (first parameter) changes, and also stores a relationship between these changes in the database 604.

The operator operates the manual operation unit 900 to input the optical condition (first parameter) under which the line profile 50 serving as a reference for matching is obtained and the optical condition (first parameter) under which the line profile 51 to be matched is obtained to the device. The image processing unit 901 acquires a line profile under each optical condition.

In the self-diagnosis system 501, the acquired line profile, the optical condition (first parameter) when the line profile 51 to be matched is obtained, and the information (third parameter) on the device configuration are input to the database 604. The learning machine 605 searches the database 604 for an optical condition (first parameter) such that the line profile 51 matches the shape of the line profile 50 serving as a reference for matching. The result display unit 902 displays the searched optical conditions, the line profile obtained under the searched optical conditions, and the line profile 50.

The operator inputs the optical conditions (first parameters) displayed by the result display unit 902 into the device, and images the sample 10 again. The image processing unit 901 acquires a line profile of the sample 10 under this optical condition. The result display unit 902 displays the line profile and the line profile 50. The operator compares the line profile and the line profile 50 displayed by the result display unit 902.

When these line profiles coincide with each other, the learning machine 605 stores the optical condition (first parameter) displayed by the result display unit 902 in the storage unit 607 as a new optical condition.

When these line profiles do not match each other, the line profiles under the optical conditions displayed by the result display unit 902 are stored in the database 604. The learning machine 605 again searches for an optical condition (first parameter) such that the line profile 51 matches the shape of the line profile 50 serving as a reference for matching.

In the present embodiment, the database 604 stores a line profile (information constituting the line profile), and matching is performed using the line profile obtained from the image obtained by imaging the sample 10. Optical conditions (first parameters) under which the line profiles match each other are obtained by matching.

In the present invention, matching can be performed using information obtained from an image obtained by imaging the sample 10 other than the line profile.

Note that the present invention is not limited to the above embodiments, and various modifications are possible. For example, the above-described embodiments have been described in detail in order to describe the present invention in an easy-to-understand manner, and the present invention is not necessarily limited to an aspect including all the described configurations. Further, a part of the configuration of one embodiment can be replaced with the configuration of another embodiment. In addition, the configuration of another embodiment can be added to the configuration of one embodiment. In addition, a part of the configuration of each embodiment can be deleted, or another configuration can be added or replaced.

REFERENCE SIGNS LIST 1 electron gun
2 electron beam
3 first converging lens
4 diaphragm
5 electron probe
6 blanker
7 faraday cup
8 second converging lens
9 objective lens
10 sample
11 deflector
12 secondary electron
13 secondary electron detector
14 control electrode
15 height sensor
50 line profile serving as reference for matching
51 line profile to be matched
101 electron source
102 extraction electrode
103 acceleration electrode
501 self-diagnosis system
601 input unit
604 database
604A standard database
604B device-specific database
605 learning machine
606 output unit
607 storage unit
701 electron gun control unit
702 lens control unit
703 blanker control unit
704 current measurement unit
705 lens control unit
706 deflection control unit
707 lens control unit
708 height sensor control unit
709 high voltage control unit
710 electrode control unit
801 central control unit
900 manual operation unit
901 image processing unit
902 result display unit
903 operation screen unit
Ip probe current
Vo acceleration voltage
Vr deceleration voltage

The invention claimed is:

1. A charged particle beam device comprising:
an electron gun that irradiates a sample with an electron beam;
an image processing unit that acquires an image of the sample from a signal generated by the sample due to the electron beam;
a database that holds correspondence between a first parameter that is an optical condition, a second parameter that is a value related to device performance, and a third parameter that is information on the device configuration, and stores a plurality of analysis values and measurement values; and
a learning machine that searches the database and obtains the first parameter that satisfies a target value of the second parameter.

2. The charged particle beam device according to claim 1, wherein
the learning machine searches and obtains the third parameter from the database using the first parameter, and
searches and obtains the first parameter satisfying the target value of the second parameter from the database under the condition of the third parameter obtained by searching the database.

3. The charged particle beam device according to claim 1, wherein
when the second parameter measured by the charged particle beam device using the first parameter obtained by searching the database does not satisfy the target value, the learning machine stores the measured second parameter and the obtained first parameter in the database in association with each other.

4. The charged particle beam device according to claim 1, wherein
- the database includes a standard database connected to a plurality of the charged particle beam devices, and
- the standard database stores an analysis result performed for each of the charged particle beam devices by the learning machine of each of the charged particle beam devices.

5. The charged particle beam device according to claim 1, wherein
- the database is provided outside the charged particle beam device.

6. The charged particle beam device according to claim 1, further comprising
- an operation screen unit that displays the first parameter stored in the database.

* * * * *